(12) United States Patent
Han et al.

(10) Patent No.: US 10,912,182 B2
(45) Date of Patent: Feb. 2, 2021

(54) SENSOR CLEANING APPARATUS

(71) Applicant: GM GLOBAL TECHNOLOGY OPERATIONS LLC, Detroit, MI (US)

(72) Inventors: Taeyoung Han, Bloomfield Hills, MI (US); Bahram Khalighi, Birmingham, MI (US); Paul E. Krajewski, Troy, MI (US); Gayatri V. Dadheech, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 361 days.

(21) Appl. No.: 15/966,376

(22) Filed: Apr. 30, 2018

(65) Prior Publication Data

US 2019/0335572 A1    Oct. 31, 2019

(51) Int. Cl.
| | |
|---|---|
| *H05H 1/24* | (2006.01) |
| *H05K 1/16* | (2006.01) |
| *G02B 27/00* | (2006.01) |
| *G01S 7/52* | (2006.01) |
| *G01S 7/497* | (2006.01) |
| *G01S 7/40* | (2006.01) |
| *G01C 25/00* | (2006.01) |
| *G02B 3/00* | (2006.01) |
| *H05K 1/09* | (2006.01) |

(52) U.S. Cl.
CPC .......... *H05H 1/2406* (2013.01); *G01C 25/00* (2013.01); *G01S 7/40* (2013.01); *G01S 7/497* (2013.01); *G01S 7/52004* (2013.01); *G02B 27/0006* (2013.01); *H05K 1/16* (2013.01); *G01S 2007/4043* (2013.01); *G01S 2007/4977* (2013.01); *G01S 2007/52011* (2013.01); *G02B 3/00* (2013.01); *G02B 2003/0093* (2013.01); *H05H 2001/2412* (2013.01); *H05K 1/09* (2013.01)

(58) Field of Classification Search
CPC .......................... H05H 1/2406; G02B 27/0006
USPC .................................................. 359/507, 509
See application file for complete search history.

(56) References Cited

U.S. PATENT DOCUMENTS

| | | | |
|---|---|---|---|
| 6,527,000 B1 * | 3/2003 | Randmae | B08B 3/024 134/102.1 |
| 7,380,756 B1 * | 6/2008 | Enloe | B64C 23/005 244/130 |
| 7,999,173 B1 * | 8/2011 | Ashpis | H01L 31/042 136/251 |
| 8,016,247 B2 * | 9/2011 | Schwimley | B64C 23/005 244/200 |
| 8,641,127 B2 * | 2/2014 | Ramsay | B62D 35/00 296/180.5 |
| 9,541,106 B1 * | 1/2017 | Patel | B64C 15/14 |

(Continued)

FOREIGN PATENT DOCUMENTS

WO    WO 2017/153899    * 9/2017

*Primary Examiner* — Ricky D Shafer
(74) *Attorney, Agent, or Firm* — Cantor Colburn LLP

(57) ABSTRACT

An apparatus configured to induce airflow over a sensor lens is provide. The apparatus includes a sensor lens; and a plasma actuator. The plasma actuator may include a dielectric element, a first electrode disposed under the dielectric element, a second electrode disposed on the dielectric element such that the second electrode is exposed, and a plasma layer disposed in between the first electrode and the second electrode. The plasma actuator may be disposed at a periphery of the sensor lens.

19 Claims, 3 Drawing Sheets

(56) References Cited

U.S. PATENT DOCUMENTS

| | | | |
|---|---|---|---|
| 10,286,880 B2* | 5/2019 | Schmidt | B60R 16/08 |
| 10,549,726 B2* | 2/2020 | Garcia Crespo | G05D 1/02 |
| 10,589,724 B2* | 3/2020 | Krishnan | G05D 1/0257 |
| 2017/0313287 A1* | 11/2017 | Davies | B60S 1/56 |
| 2018/0015907 A1* | 1/2018 | Rice | B60S 1/52 |
| 2018/0361997 A1* | 12/2018 | Schmidt | G02B 27/00 |
| 2019/0391387 A1* | 12/2019 | Neophytou | H01T 19/00 |

* cited by examiner

SENSOR CLEANING APPARATUS

INTRODUCTION

Apparatuses and methods consistent with exemplary embodiments relate to sensors. More particularly, apparatuses and methods consistent with exemplary embodiments relate to sensor cleaning.

SUMMARY

One or more exemplary embodiments provide a sensor cleaning apparatus. More particularly, one or more exemplary embodiments provide a sensor cleaning apparatus configured to induce airflow over a sensor lens.

According to an aspect of an exemplary embodiment, an apparatus configured to induce airflow over a sensor lens is provided. The apparatus includes a sensor lens, and a plasma actuator comprising a dielectric element, a first electrode disposed under the dielectric element, a second electrode disposed on the dielectric element such that the second electrode is exposed, and a plasma layer disposed in between the first electrode and the second electrode. The plasma actuator is disposed at a periphery of the sensor lens.

The sensor lens may be a circular lens, the plasma actuator may be shaped like an arc of a length that is less than a circumference of the circular lens, and the arc may be disposed around the lens.

The sensor lens may be a circular lens and the plasma actuator may be a rectangular strip disposed on at least one from among a top, a bottom, and a side of the lens.

The sensor lens may be a cylindrical lens and the plasma actuator may be a rectangular strip disposed along a circumference of the lens.

The rectangular strip may be disposed along a base substantially perpendicular to the cylindrical lens.

The rectangular strip may be disposed along an entire circumference of the cylindrical lens. The rectangular shape strip may be disposed along a base of the cylindrical lens.

The sensor lens may be a cylindrical lens, the cylindrical lens including a top base with a first diameter and a bottom base with a second diameter that is longer than the first diameter, and the plasma actuator may be a sawtooth shape disposed on along a base substantially perpendicular to a circumference of the bottom base of the cylindrical lens.

The sawtooth shape strip may be disposed along an entire circumference of the base of the cylindrical lens.

The plasma actuator may be a printed circuit. The printed circuit may include a repeating pattern such as a repeating rectangular pattern, a repeating parabolic pattern, or a repeating sawtooth pattern. The printed circuited may be printed in copper based ink.

The plasma actuator and the sensor lens may be disposed on a vehicle in manner to enable the plasma actuator to induce airflow over the sensor of the vehicle.

The sensor lens may be a sensor lens of at least one from among a lidar, a camera, a radar, an ultrasonic sensor, and odometry sensor.

The apparatus may include a power supply configured to supply power to the plasma actuator. The apparatus of claim 18, further comprising a DC to DC converter configured to covert the power supplied by the power supply to an appropriate voltage and frequency to operate the plasma actuator.

The apparatus may include a transformer configured to covert AC power supplied by the power supply to an appropriate AC voltage and frequency to operate the plasma actuator.

Other objects, advantages and novel features of the exemplary embodiments will become more apparent from the following detailed description of exemplary embodiments and the accompanying drawings.

BRIEF DESCRIPTION OF THE DRAWINGS

The disclosed examples will hereinafter be described in conjunction with the following drawing figures, wherein like numerals denote like elements, and wherein.

DETAILED DESCRIPTION

Figure 1:
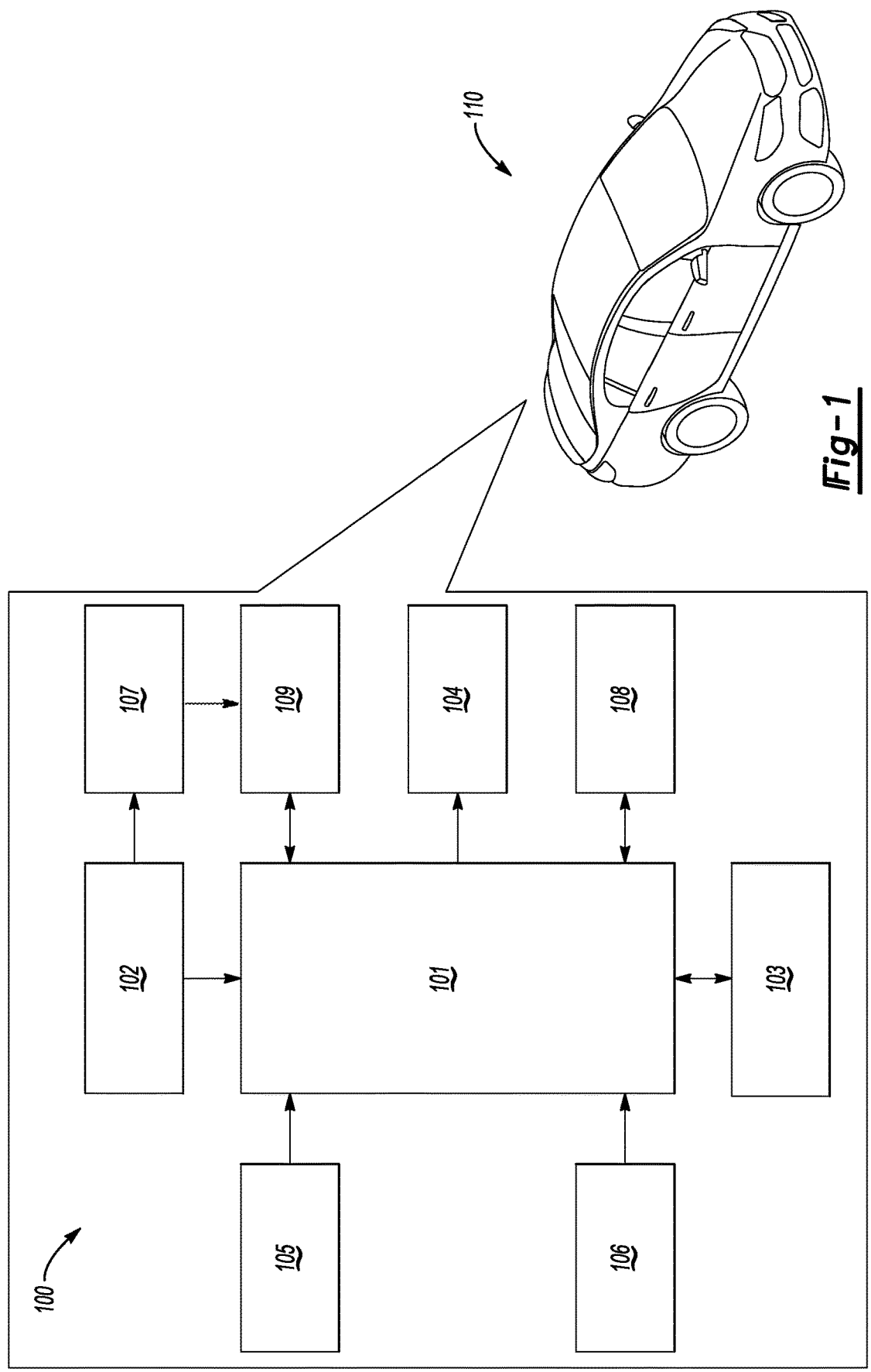
FIG. 1 shows a block diagram of a sensor cleaning apparatus or apparatus configured to induce airflow over a sensor lens according to an exemplary embodiment.

An apparatus configured to induce airflow over a sensor lens (i.e., a sensor cleaning apparatus) will now be described in detail with reference to FIGS. 1-5 of the accompanying drawings in which like reference numerals refer to like elements throughout.

The following disclosure will enable one skilled in the art to practice the inventive concept. However, the exemplary embodiments disclosed herein are merely exemplary and do not limit the inventive concept to exemplary embodiments described herein. Moreover, descriptions of features or aspects of each exemplary embodiment should typically be considered as available for aspects of other exemplary embodiments.

It is also understood that where it is stated herein that a first element is "connected to," "attached to," "formed on," or "disposed on" a second element, the first element may be connected directly to, formed directly on or disposed directly on the second element or there may be intervening elements between the first element and the second element, unless it is stated that a first element is "directly" connected to, attached to, formed on, or disposed on the second element. In addition, if a first element is configured to "send" or "receive" information from a second element, the first element may send or receive the information directly to or from the second element, send or receive the information via a bus, send or receive the information via a network, or send or receive the information via intermediate elements, unless the first element is indicated to send or receive information "directly" to or from the second element.

Throughout the disclosure, one or more of the elements disclosed may be combined into a single device or into one or more devices. In addition, individual elements may be provided on separate devices.

Automated or autonomous control systems are being developed and equipped on vehicles. These systems are designed to take over aspects of controlling a vehicle from a human driver. For example, automated or autonomous control systems may control steering, braking, windshield wipers, HVAC systems, charging systems, etc. When a vehicle is operating in automated or autonomous control mode, the vehicle relies on information from sensors to perceive its environment. For example, a camera, a radar, an ultrasonic sensor, and a lidar are all examples of sensors that provide information on an environment to automated or autonomous control systems. However, often sensors or their lenses become dirty due to debris or other environmental conditions. Thus, the sensors may be equipped with cleaning devices that aid in keeping the sensor clean or a lens of the sensor clear.

Examples of cleaning devices may include wipers and spray devices. However, one type of device that may be used to induce airflow over a sensor is a plasma actuator. The plasma actuator may be used in applications to reduce drag or to facilitate aerodynamics. However, according to an aspect of an exemplary embodiment, a plasma actuator may be designed to induce airflow over a sensor or sensor lens, thereby clearing the sensor or sensor lens from debris and helping to keep it clean and dry.

FIG. 1 shows a block diagram of an apparatus configured to induce airflow over a sensor lens 100 according to an exemplary embodiment. As shown in FIG. 1, the apparatus configured to induce airflow over a sensor lens 100, according to an exemplary embodiment, includes a controller 101, a power supply 102, a storage 103, an output 104, a sensor 105, a user input 106, a power converter 107, a communication device 108 and a plasma actuator 109. However, the apparatus configured to induce airflow over a sensor lens 100 is not limited to the aforementioned configuration and may be configured to include additional elements and/or omit one or more of the aforementioned elements. The apparatus configured to induce airflow over a sensor lens 100 may be implemented as part of a vehicle, as a standalone component, as a hybrid between an on vehicle and off vehicle device, or in another computing device.

The controller 101 controls the overall operation and function of the apparatus configured to induce airflow over a sensor lens 100. The controller 101 may directly or indirectly control one or more of a power supply 102, a storage 103, an output 104, a sensor 105, a user input 106, a power converter 107, a communication device 108 and a plasma actuator 109, of the apparatus configured to induce airflow over a sensor lens 100. The controller 101 may include one or more from among a processor, a microprocessor, a central processing unit (CPU), a graphics processor, Application Specific Integrated Circuits (ASICs), Field-Programmable Gate Arrays (FPGAs), state machines, circuitry, and a combination of hardware, software and firmware components.

The controller 101 is configured to send and/or receive information from one or more of the power supply 102, the storage 103, the output 104, the sensor 105, the user input 106, the power converter 107, the communication device 108 and the plasma actuator 109 of the apparatus configured to induce airflow over a sensor lens 100. The information may be sent and received via a bus or network, or may be directly read or written to/from one or more of the power supply 102, the storage 103, the output 104, the sensor 105, the user input 106, the power converter 107, the communication device 108 and the plasma actuator 109 of the apparatus configured to induce airflow over a sensor lens 100. Examples of suitable network connections include a controller area network (CAN), a media oriented system transfer (MOST), a local interconnection network (LIN), a local area network (LAN), wireless networks such as Bluetooth and 802.11, and other appropriate connections such as Ethernet.

The power supply 102 provides power to one or more of the storage 103, the output 104, the sensor 105, the user input 106, the power converter 107, the communication device 108 and the plasma actuator 109, of the apparatus configured to induce airflow over a sensor lens 100. The power supply 102 may include one or more from among a battery, an outlet, a capacitor, a solar energy cell, a generator, a wind energy device, an alternator, etc.

The storage 103 is configured for storing information and retrieving information used by the apparatus configured to induce airflow over a sensor lens 100. The storage 103 may be controlled by the controller 101 to store and retrieve information received from one or more sensors 105 as well as computer or machine executable instructions to control the plasma actuator 109. The storage 103 may include one or more from among floppy diskettes, optical disks, CD-ROMs (Compact Disc-Read Only Memories), magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, cache memory, and other type of media/machine-readable medium suitable for storing machine-executable instructions.

The output 104 outputs information in one or more forms including: visual, audible and/or haptic form. The output 104 may be controlled by the controller 101 to provide outputs to the user of the apparatus configured to induce airflow over a sensor lens 100. The output 104 may include one or more from among a speaker, audio, a display, a centrally-located display, a head up display, a windshield display, a haptic feedback device, a vibration device, a tactile feedback device, a tap-feedback device, a holographic display, an instrument light, an indicator light, etc.

The output 104 may output notification including one or more from among an audible notification, a light notification, and a display notification. The notification may include information notifying of the activation of the plasma actuator 109. The output 104 may also display images and information provided by one or more sensors 105.

The sensor 105 may include one or more from among a lidar, a radar, an ultrasonic sensor, a video camera, a still image camera, an antenna, an infrared camera, and any other sensor suitable for perceiving an environment around the apparatus configured to induce airflow over a sensor lens 100.

The user input 106 is configured to provide information and commands to the apparatus configured to induce airflow over a sensor lens 100. The user input 106 may be used to provide user inputs, etc., to the controller 101. The user input 106 may include one or more from among a touchscreen, a keyboard, a soft keypad, a button, a motion detector, a voice input detector, a microphone, a camera, a trackpad, a mouse, a touchpad, etc. The user input 106 may be configured to receive a user input to acknowledge or dismiss the notification output by the output 104. The user input 106 may also be configured to receive a user input to activate or deactivate the apparatus configured to induce airflow over a sensor lens 100.

The power supply converter 107 may comprise circuitry including a direct current to direct current convertor and pulse generator such as a solid-state pulse generator. According to one example, the power supply converter 107 may include transformer configured to convert AC power supplied by the power supply to an AC voltage and frequency to operate the plasma actuator. According to another example, the power supply converter 107 may include a direct current (DC) to DC converter configured to covert the power supplied by the power supply to an appropriate voltage and frequency to operate the plasma actuator. According to yet another example, the power supply converter 107 may be configured to convert 12V direct court power supplied by the power supply 102 to a 10 KV 500 HZ DC signal.

The communication device 108 may be used by apparatus configured to induce airflow over a sensor lens 100 to communicate with several types of external apparatuses according to various communication methods. The communication device 108 may be used to send/receive various information such as information on operation mode of the vehicle and control information for operating the apparatus configured to induce airflow over a sensor lens 100 to/from the controller 101.

The communication device 108 may include various communication modules such as one or more from among a telematics unit, a broadcast receiving module, a near field communication (NFC) module, a GPS receiver, a wired communication module, or a wireless communication module. The broadcast receiving module may include a terrestrial broadcast receiving module including an antenna to receive a terrestrial broadcast signal, a demodulator, and an equalizer, etc. The NFC module is a module that communicates with an external apparatus located at a nearby distance according to an NFC method. The GPS receiver is a module that receives a GPS signal from a GPS satellite and detects a current location. The wired communication module may be a module that receives information over a wired network such as a local area network, a controller area network (CAN), or an external network. The wireless communication module is a module that is connected to an external network by using a wireless communication protocol such as IEEE 802.11 protocols, WiMAX, Wi-Fi or IEEE communication protocol and communicates with the external network. The wireless communication module may further include a mobile communication module that accesses a mobile communication network and performs communication according to various mobile communication standards such as $3^{rd}$ generation (3G), $3^{rd}$ generation partnership project (3GPP), long-term evolution (LTE), Bluetooth, EVDO, CDMA, GPRS, EDGE or ZigBee.

Figure 2:
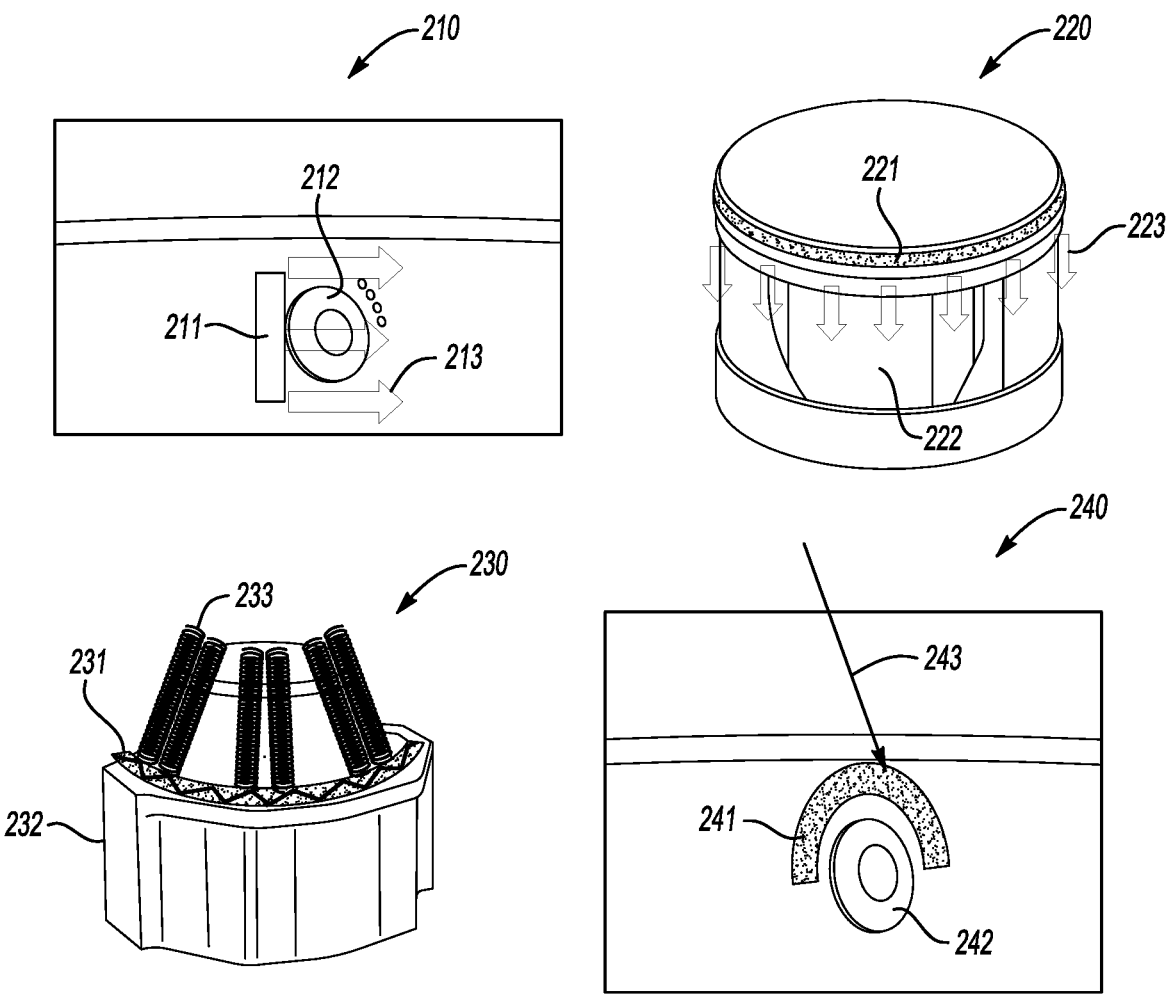
FIG. 2 shows illustrations of applications of the sensor cleaning apparatus or the apparatus configured to induce airflow over a sensor lens apparatus according to several aspects of exemplary embodiments.

FIG. 2 shows illustrations of applications of the apparatus configured to induce airflow over a sensor lens apparatus according to several aspects of exemplary embodiments. Referring to FIG. 2, four examples (210, 220, 230 and 240) of the apparatus configured to induce airflow over a sensor lens 100 are shown. In these examples, the apparatus configured to induce airflow over a sensor lens 100 is embodied as a plasma actuator that is activated to induce airflow over lenses of various sensors.

Plasma actuator 210 is a rectangular strip 211 that is disposed along a left edge of sensor 212 and configured to induce airflow 213 from left to right across sensor 212. The position of plasma actuator 210 is merely exemplary and plasma actuator 210 may be disposed along a top, bottom, or right edge of sensor 212 and configured to induce airflow 213 across the sensor 212 in various directions.

Plasma actuator 220 is a rectangular or cylindrical strip 221 that is disposed along a top circumference of a cylindrical sensor 222 and configured to induce airflow 223 from a top to a bottom of sensor 222. The position of plasma actuator 220 is merely exemplary and plasma actuator 220 may be disposed along a bottom circumference of a cylindrical sensor 222 and configured to induce airflow 223 from the bottom to the top of sensor 222.

Plasma actuator 230 is a rectangular or cylindrical strip 231 that is disposed circumferentially along a base of a domed sensor 232 and configured to induce vortex airflow 233 from a bottom to a top of sensor 232. The rectangular or cylindrical strip 231 may be offset from the plane of the base of the domed sensor 232 by an angle to better direct airflow at the lens of the domed sensor 232. The position of plasma actuator 230 is merely exemplary and plasma actuator 230 may be disposed circumferentially along a top base of a domed sensor 232 and configured to induce airflow 233 from the top to the bottom of sensor 232.

Plasma actuator 240 is a semi-circular strip 241 that is disposed along an arc of sensor 242 and configured to induce airflow 243 from top to bottom across sensor 242. The position of plasma actuator 240 is merely exemplary and plasma actuator 240 may be disposed along a left, bottom, or right edge of sensor 242 and configured to induce airflow 243 across the sensor 242 in various directions.

Figure 3:
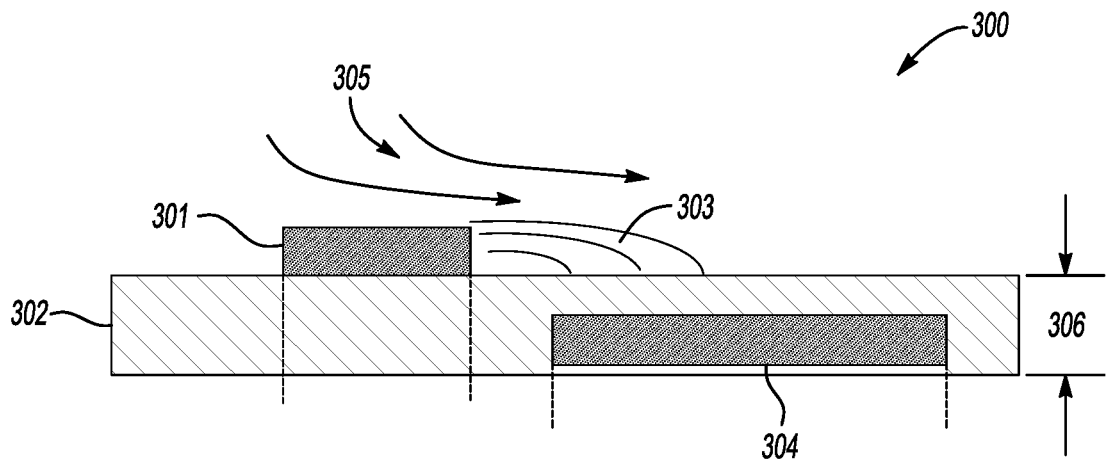
FIG. 3 shows a plasma actuator of the sensor cleaning apparatus or the apparatus configured to induce airflow over a sensor lens according to an aspect of an exemplary embodiment.

FIG. 3 shows a plasma actuator 300 of the apparatus configured to induce airflow over a sensor lens according to an aspect of an exemplary embodiment. Referring to FIG. 3, an exposed electrode 301 is disposed on a top left side of dielectric 302. A hidden electrode 304 is disposed within a bottom right portion of dielectric 302. In addition, a plasma layer 303 disposed on a top side of dielectric 302 between exposed electrode 301 and hidden electrode 304. The induced airflow 305 between the exposed electrode 301 and hidden electrode 304 is affected the input voltage and the input frequency.

Figure 4:
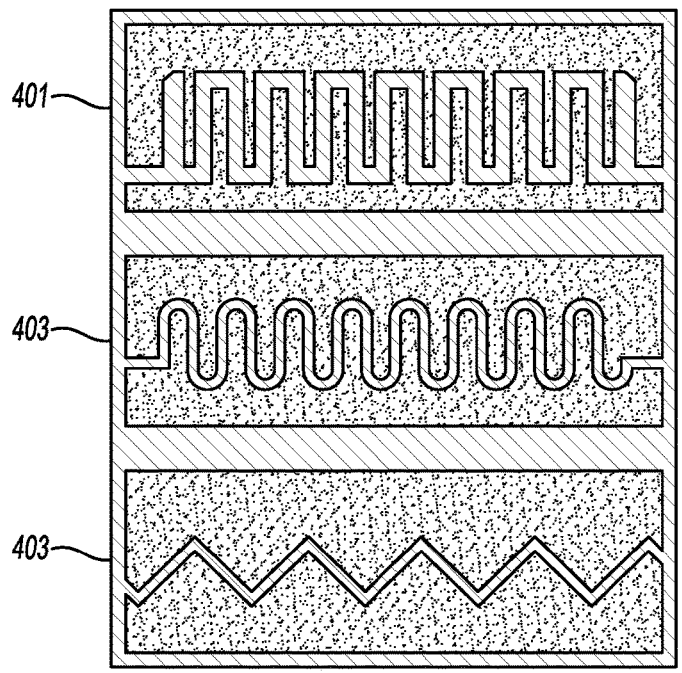
FIG. 4 shows illustrations of printed circuited boards embodying plasma actuators of the sensor cleaning apparatus or the apparatus configured to induce airflow over a sensor lens according to several aspects of exemplary embodiments.

FIG. 4 shows illustrations of printed circuited boards embodying plasma actuators according to several aspects of exemplary embodiments. Referring to FIG. 4, numerous examples of plasma actuators embodied by printed circuited boards are shown.

Plasma actuator 401 is printed according to a square wave pattern. Plasma actuator 402 is printed according to a sinusoidal wave pattern. Plasma actuator 403 is printed according to a zig zag, sawtooth or triangular pattern.

Figure 5:
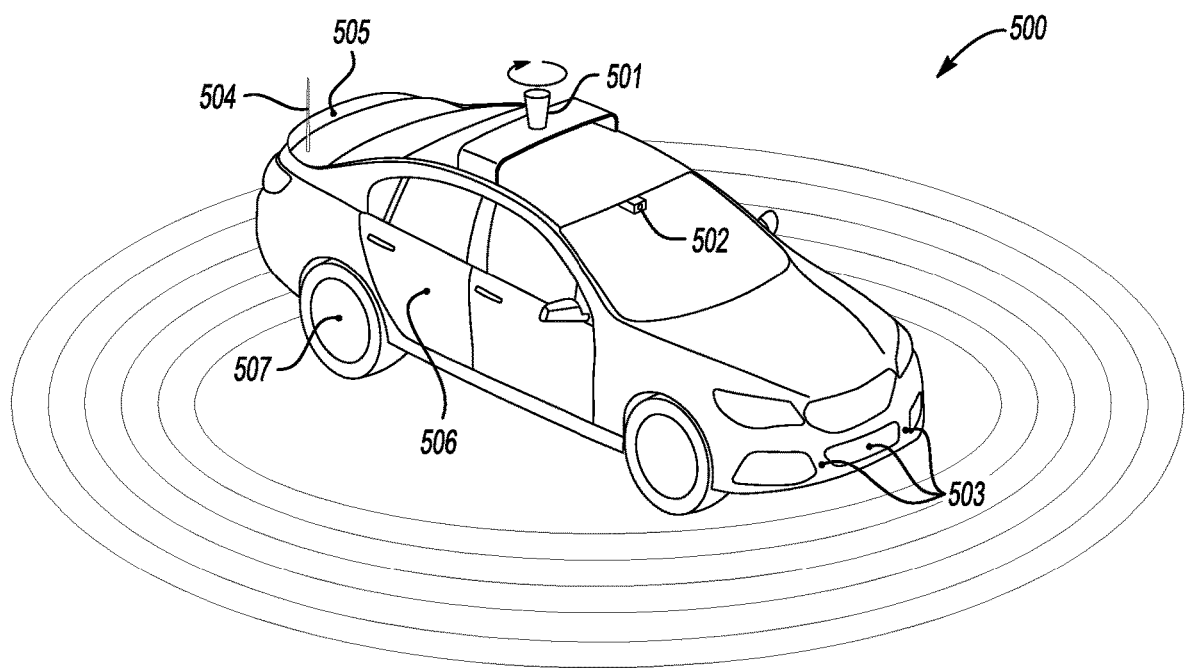
FIG. 5 shows illustrations of various applications of the sensor cleaning apparatus or the apparatus configured to induce airflow over a sensor lens.

FIG. 5 shows illustrations of various applications of the apparatus configured to induce airflow over a sensor lens 100. Referring to FIG. 5, a vehicle 500 contains various sensors 501-507 that may be cleaned by the apparatus configured to induce airflow over a sensor lens 100. For example, one or more of lidar sensors 501, front camera 502, radar sensors 503, GPS antenna 504, rear camera 505, ultrasonic sensors 506 and/or odometry sensors 507 disposed at various locations on a vehicle may be cleaned the apparatus configured to induce airflow over a sensor lens 100.

The processes, methods, or algorithms disclosed herein can be deliverable to/implemented by a processing device, controller, or computer, which can include any existing programmable electronic control device or dedicated electronic control device. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

One or more exemplary embodiments have been described above with reference to the drawings. The exemplary embodiments described above should be considered in a descriptive sense only and not for purposes of limitation. Moreover, the exemplary embodiments may be modified without departing from the spirit and scope of the inventive concept, which is defined by the following claims.

What is claimed is:

1. An apparatus configured to induce airflow over a sensor lens, the apparatus comprising:
    a cylindrical sensor lens including a base; and
    a plasma actuator operable to induce an airflow over the lens, the plasma actuator including a dielectric element, a first electrode disposed under the dielectric element, a second electrode disposed on the dielectric element such that the second electrode is exposed, and a plasma layer disposed in between the first electrode and the second electrode,
        wherein the plasma actuator is disposed on one of the base, a side, and a top of the cylindrical sensor lens substantially perpendicular to a circumference of the one of the base and the top of the cylindrical sensor lens.

2. The apparatus of claim 1, wherein the cylindrical sensor lens comprises a circular cross section,
    wherein the plasma actuator comprises an arc of a length that is less than a circumference of the circular cross section, the arc being disposed around the cylindrical sensor lens.

3. The apparatus of claim 1, wherein
    the plasma actuator comprises a rectangular strip disposed on the at least one of a top, a bottom, and a side of the cylindrical sensor lens.

4. The apparatus of claim 1, wherein
    the plasma actuator comprises a rectangular strip disposed along a circumference of the cylindrical sensor lens.

5. The apparatus of claim 4, wherein the rectangular strip is disposed along the base.

6. The apparatus of claim 4, wherein the rectangular shape strip is disposed along an entire circumference of the cylindrical sensor lens.

7. The apparatus of claim 1, wherein the cylindrical sensor lens includes a top base with a first diameter and a bottom base with a second diameter that is longer than the first diameter,
    wherein the plasma actuator comprises a sawtooth shape strip.

8. The apparatus of claim 7, wherein the sawtooth shape strip is disposed along an entire circumference of the base of the cylindrical sensor lens.

9. The apparatus of claim 1, wherein the plasma actuator comprises a printed circuit.

10. The apparatus of claim 9, wherein the printed circuit comprises a repeating rectangular pattern.

11. The apparatus of claim 9, wherein the printed circuit comprises a repeating parabolic pattern.

12. The apparatus of claim 9, wherein the printed circuit comprises a repeating sawtooth pattern.

13. The apparatus of claim 9, wherein the printed circuit comprises a repeating pattern.

14. The apparatus of claim 9, wherein the printed circuited is printed in copper based ink.

15. The apparatus of claim 1, wherein the plasma actuator and the sensor lens are disposed on a vehicle in manner to enable the plasma actuator to induce airflow over the sensor of the vehicle.

16. The apparatus of claim 1, wherein the cylindrical sensor lens defines part of at least one of a lidar, a camera, a radar, an ultrasonic sensor, and odometry sensor.

17. The apparatus of claim 1, further comprising a power supply configured to supply power to the plasma actuator.

18. The apparatus of claim 17, further comprising a direct current (DC) to DC converter configured to covert the power supplied by the power supply to an appropriate voltage and frequency to operate the plasma actuator.

19. The apparatus of claim 17, further comprising a transformer configured to convert an alternating current (AC) power supplied by the power supply to an AC voltage and frequency to operate the plasma actuator.

* * * * *